(12) United States Patent
Kim et al.

(10) Patent No.: US 7,218,097 B2
(45) Date of Patent: May 15, 2007

(54) WAFER TEST EQUIPMENT AND METHOD OF ALIGNING TEST EQUIPMENT

(75) Inventors: Jung-Nam Kim, Suwon-si (KR); Young-Jong Kim, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/104,337

(22) Filed: Apr. 12, 2005

(65) Prior Publication Data

US 2005/0264279 A1 Dec. 1, 2005

(30) Foreign Application Priority Data

May 28, 2004 (KR) ...................... 10-2004-0038326

(51) Int. Cl.
*G01R 31/02* (2006.01)
(52) U.S. Cl. .................................... 324/158.1; 324/758
(58) Field of Classification Search ...................... None
See application file for complete search history.

(56) References Cited

U.S. PATENT DOCUMENTS

| 4,665,360 | A | * | 5/1987 | Phillips | ....................... 324/754 |
| 5,150,041 | A | * | 9/1992 | Eastin et al. | ................. 324/758 |
| 5,410,259 | A | * | 4/1995 | Fujihara et al. | ............. 324/758 |
| 5,656,942 | A | * | 8/1997 | Watts et al. | ................. 324/754 |
| 5,742,173 | A | * | 4/1998 | Nakagomi et al. | .......... 324/758 |
| 5,821,764 | A | * | 10/1998 | Slocum et al. | ............... 324/758 |
| 6,037,791 | A | * | 3/2000 | Yap et al. | .................... 324/758 |
| 6,111,419 | A | * | 8/2000 | Lefever et al. | ............. 324/754 |
| 6,741,072 | B2 | * | 5/2004 | Orsillo | ..................... 324/158.1 |
| 6,894,480 | B2 | * | 5/2005 | Back | ....................... 324/158.1 |

FOREIGN PATENT DOCUMENTS

| JP | 07-174819 | 7/1995 |
| JP | 2000-315711 | 11/2000 |
| KR | 1996-025399 | 7/1996 |
| KR | 2003-0060221 | 7/2003 |

OTHER PUBLICATIONS

Patent Abstracts of Japan for Publication No. 07-174819.
Patent Abstracts of Japan for Publication No. 2000-315711.
Korean Intellectual Property Office, Korean Patent Abstract for Publication No. 2003-0060221.
Abstract of Korean Utility Application No. 20-1994-0036955 (Publication No. 1996-025399).

* cited by examiner

*Primary Examiner*—Minh N. Tang
(74) *Attorney, Agent, or Firm*—F. Chau & Associates, LLC

(57) ABSTRACT

Wafer test equipment includes a probe station having a wafer chuck for supporting a wafer, a test head disposed on the probe station, a manipulator for moving the test head to and from an upper surface of the probe station, and an alignment monitoring member for monitoring an alignment of the test head docked to the probe station.

11 Claims, 7 Drawing Sheets

WAFER TEST EQUIPMENT AND METHOD OF ALIGNING TEST EQUIPMENT

CROSS-REFERENCE TO RELATED APPLICATION

This application claims priority to Korean Patent Application 2004-38326 filed on May 28, 2004, in the Korean Intellectual Property Office, the disclosure of which is herein incorporated by reference in its entirety.

TECHNICAL FIELD

The disclosure relates to wafer test equipment and method of arranging the wafer test equipment, and more particularly to wafer test equipment for testing a semiconductor device on a semiconductor substrate using electrical signals.

BACKGROUND

In general, when semiconductor devices are fabricated on a wafer, reliability testing is performed for semiconductor devices on the wafer using electrical signals applied thereto. In particular, Electrical Die Sorting (EDS) test can be used to test for defects of semiconductor devices on the wafer using direct electrical contacts. A machine for performing an EDS test is called as a wafer probing machine or wafer test equipment.

In a conventional EDS test, an electrical characteristic of a semiconductor is tested by contacting a needle-shaped probe to a surface of a metal pad formed on a semiconductor chip. A probe card needs to be replaced with a new probe card based on a type of a wafer to be tested or the test environment. The probe card also needs to be replaced when the probe card is broken or worn out. In the conventional test equipment, a docking position of a test head must be set up each time the probe card is replaced.

A conventional method of aligning the test head requires repeated operations which, depending on the operator's experience, can be time consuming. Furthermore, it is difficult to set an exact docking position of the test head because a position of the test head deviates from its initial position after the repeated operations.

Therefore, a need exists for wafer test equipment that is capable of setting an exact docking position of the test head, thereby reducing testing errors and increasing production efficiency.

SUMMARY OF THE INVENTION

In an exemplary embodiment of the present invention, wafer test equipment comprises a probe station having a wafer chuck for supporting a wafer, a test head disposed on the probe station, a manipulator for moving the test head to and from an upper surface of the probe station, and an alignment monitoring member for monitoring an alignment of the test head docked to the probe station.

In another exemplary embodiment of the present invention, a method of arranging wafer test equipment comprises setting a docking position of a probe station and a test head, placing a first monitoring tool to the test head and placing a second monitoring tool on the probe station, and adjusting a position of a confirmation window of the first monitoring tool and a position of the display unit of the second monitoring tool so that the reference marks on the confirmation window of the first and the second monitoring tools to be corresponding to each other.

In still another exemplary embodiment of the present invention, an alignment monitoring member for wafer test equipment having a test head and a probe station comprises a first monitoring tool having a light source, and a second monitoring tool having a reference mark for receiving light that is irradiated from the light source of the first monitoring tool to align the test head and the probe station.

These and other exemplary embodiments, features and advantages of the present invention will become more apparent by describing in detail exemplary embodiments thereof with reference to the attached drawings.

DESCRIPTION OF EXEMPLARY EMBODIMENTS

Figure 1:
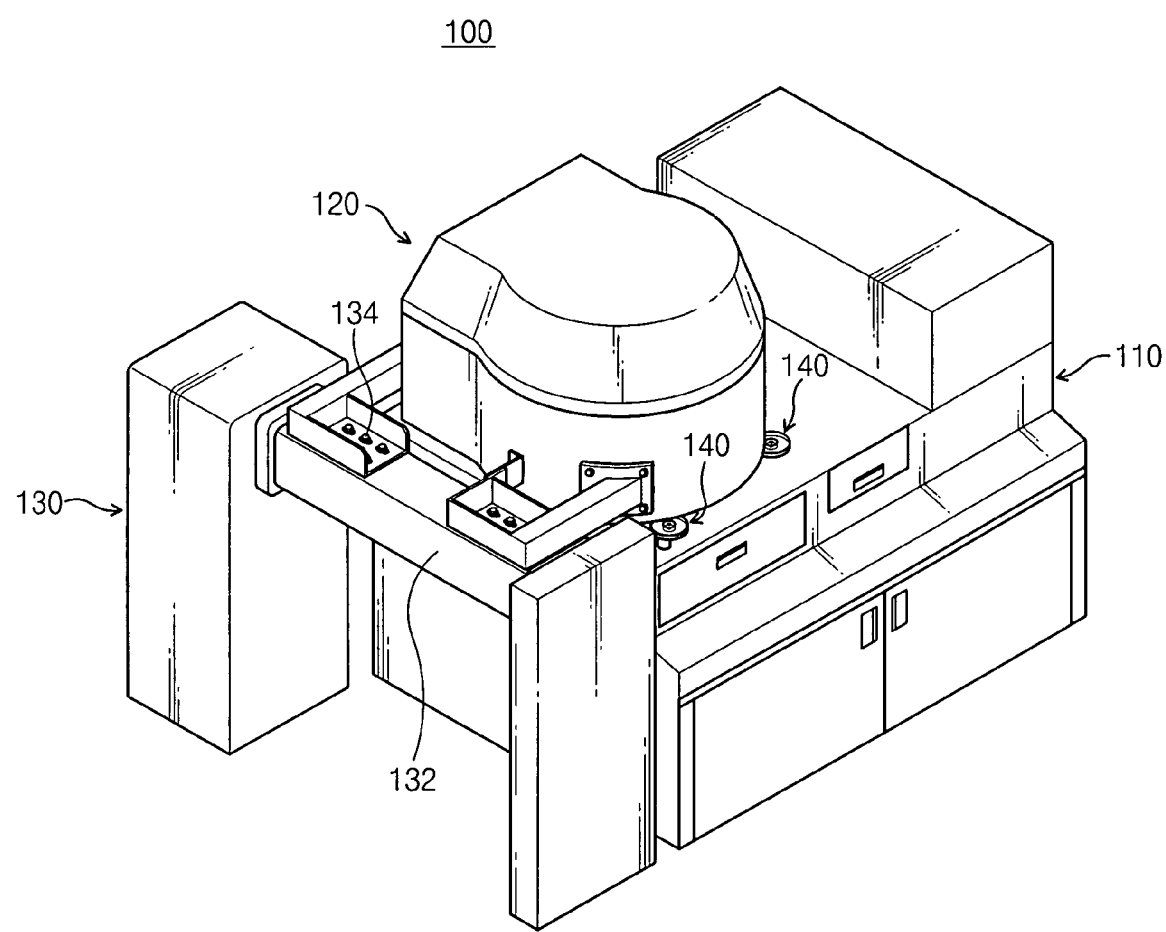
FIG. 1 is a perspective view illustrating wafer test equipment according to an exemplary embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, shapes of some elements are exaggerated for clarity.

Figure 2:
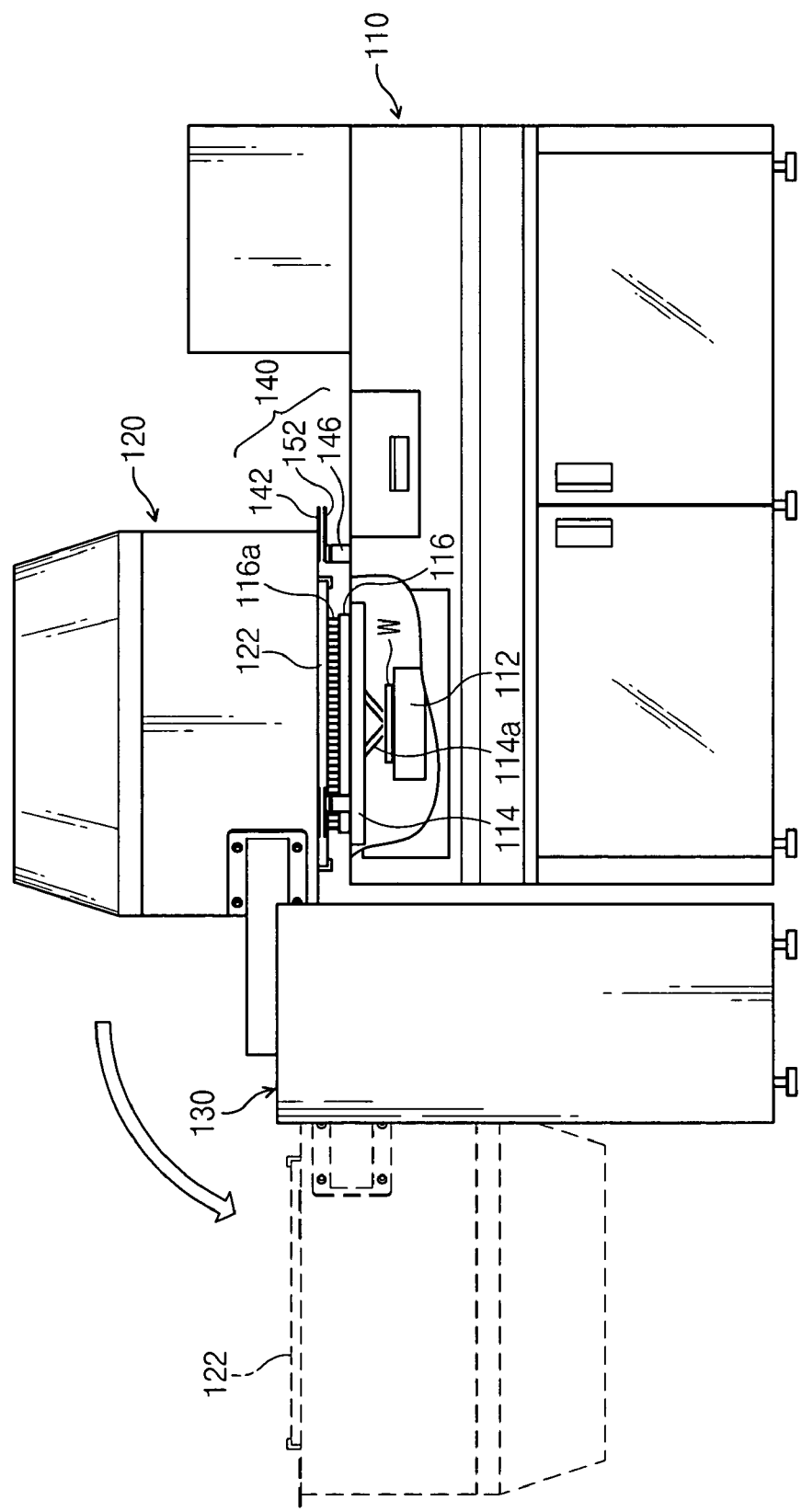
FIG. 2 is a side view illustrating wafer test equipment according to an exemplary embodiment of present invention.
Figure 3:
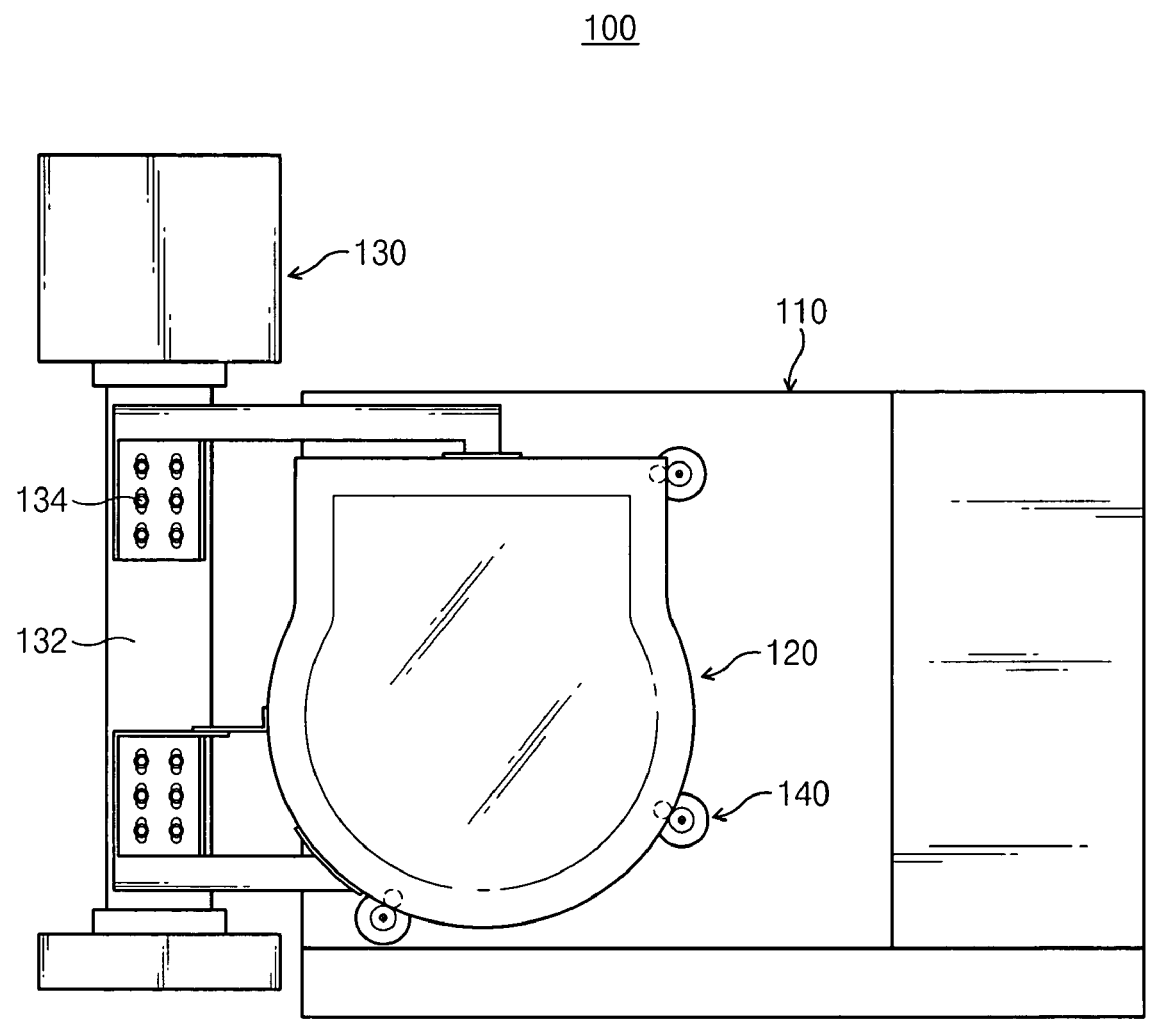
FIG. 3 is a top view illustrating wafer test equipment according to an exemplary embodiment of the present invention.
Figure 4:
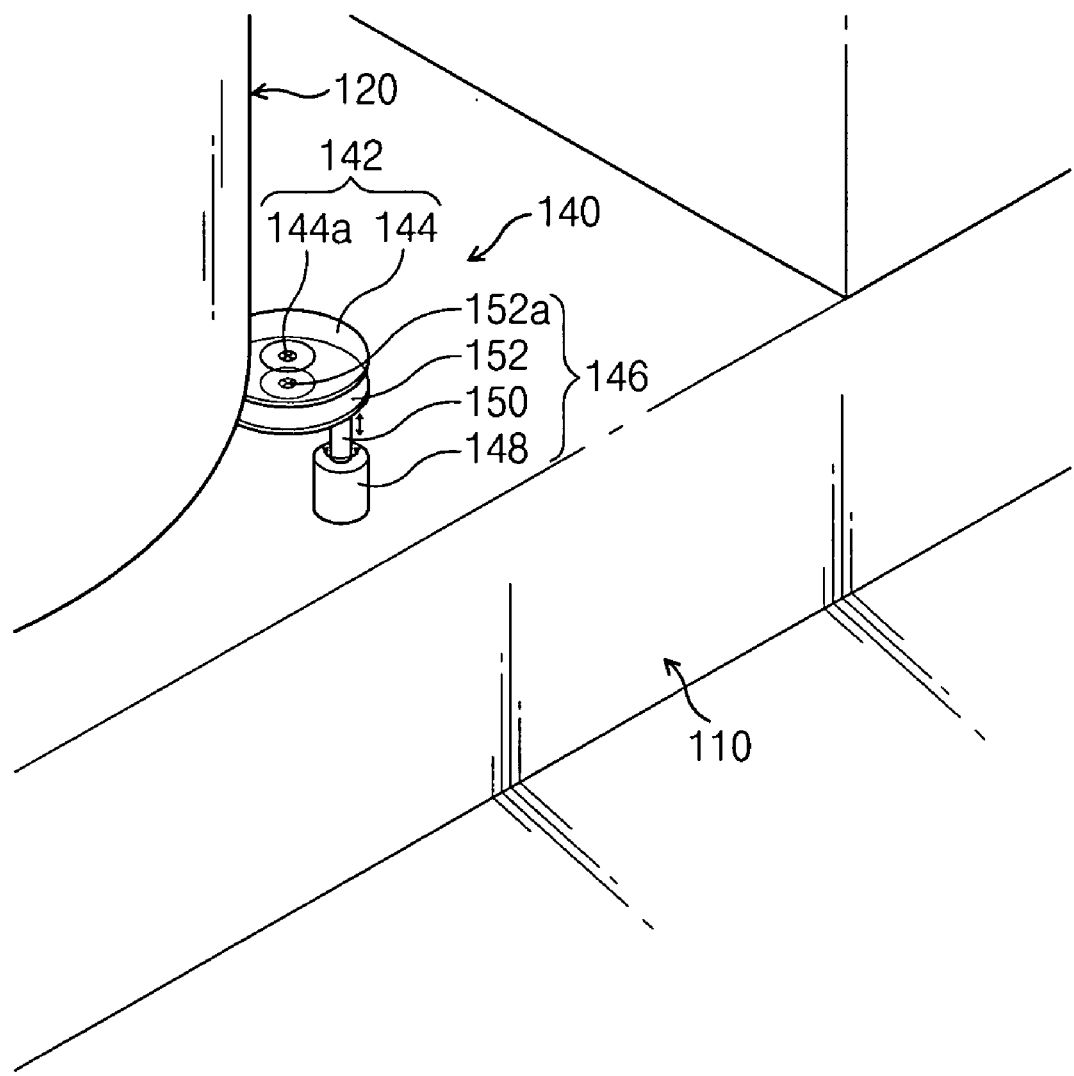
FIG. 4 is a view illustrating an alignment monitoring member according to an exemplary embodiment of the present invention.

Hereinafter, exemplary embodiments of the invention will be described in conjunction with FIG. 1 to FIG. 7, wherein the same reference numerals in the drawings represent the same or similar element. FIGS. 1 to 3 illustrate wafer test equipment according to an exemplary embodiment of the present invention. FIG. 4 is a view of showing an alignment monitoring member placed on a probe station and at a test head.

Referring to FIGS. 1 to 3, test equipment 100 comprises a test head 120 which swings, ascends or descends. A manipulator 130 is disposed at a side of the probe station 110. The manipulator 130 makes the test head 120 swing, ascend or descend from an upper surface of the probe station 110. The manipulator 130 controls a position and a height for docking/undocking of the test head 120. The manipulator 130 applies an electrical signal to the test head 120 under control of an executable program. The test head 120 is fixedly attached to a driving axis 132 of the manipulator 130 by a plurality of bolts 134. A movement of the driving axis 132 can be performed using, for example, a motor, a belt, a ball screw and other suitable elements or technology.

The test head 120 comprises a performance board 122 to which an electrical signal is applied from the manipulator 130. The probe station 110 comprises a pogo block 116 having a plurality of pogo pin 116a to which an electrical signal is applied from the performance board 122. A probe card 114 is positioned under the pogo block 116. Under the probe card 114, a chuck 112 is positioned. A wafer W is mounted on the chuck 112 to be contacted with a probe 114a of the probe card 114.

Referring to FIGS. 3 and 4, a monitoring member 140 monitors an alignment of the test head 120 which is mounted on the probe station 110. The monitoring member 140 can be positioned, for example, at three different locations as shown in FIG. 3.

The monitoring member 140 comprises a first monitoring tool 142 and a second monitoring tool 146. The first monitoring tool 142 is removably attached to the test head 120. The first monitoring tool 142 has a confirmation window 144 with a reference mark 144a. In one exemplary embodiment of the present invention, the confirmation window 144 is made of a transparent material. The second monitoring tool 146 is disposed on the probe station 110 in a position corresponding to the first monitoring tool 142. The second monitoring tool 146 comprises a display unit 152 with a reference mark 152a.

An alignment of the test head 120 can be monitored when the reference mark 144a of the first monitoring tool 142 is corresponding to the reference mark 152a of the second monitoring tool 146. If the display unit 152 is distant from the confirmation window 144 or if controlling a distance between the display unit 152 and the confirmation window 144 is difficult, the monitoring results of a correspondence between the reference mark 144a and the reference mark 152a may be vary based on an operator's viewpoint.

To minimize the above problem, in one exemplary embodiment of the present invention, the second monitoring tool 146 includes a body 148 fixedly positioned on an upper face of the probe station 110. The body 148 includes a vertical bar 150, which is upwardly and downwardly movable. The display unit 152 is fixedly attached to an upper part of the vertical bar 150. The display unit 152 of the second monitoring tool 146 rotates and the height of the display unit 152 can be adjusted using the vertical bar 150 to reduce the distance from the confirmation window 144 of the first monitoring tool and the display unit 152 of the second monitoring tool 146.

Hereinafter, exemplary embodiments of an operation of the wafer test equipment 100 and a method of arranging the test head 120 of the present invention will be described.

As shown in FIG. 2, in the wafer test equipment 100, the wafer W to be tested is mounted on the chuck 112 by a transfer apparatus. Then the chuck 112 moves upwardly toward the probe 114a of the probe card 114 so that the probe 114a contacts a pad on the wafer W. An electrical signal for test is applied from the manipulator 130 while the semiconductor contacts the probe 114a. The test signal is transferred to the probe card 114 through the test head 120 to test the wafer W.

Before testing the wafer W, an operation for setting a docking position of the test head 120 and the probe station 110 is performed. Brief explanation about this operation, i.e., a set-up process, according to an exemplary embodiment of the present invention will be described as follows.

A tape is attached to a surface of the performance board 122 that is positioned at a lower surface of the test head 120 when the test head 120 is undocked as shown in FIG. 2 in disconnected lines. As shown in FIG. 2, when the test head 120 is closed (i.e., when the test head 120 is docked), the performance board 122 and the pogo pins 116a on the pogo block 116 of the probe station 110 are contacted to each other. On a surface of the tape attached to the performance board 122, a trace is formed by the pogo pins 116a. Any deviation of the test head 120 can be determined by examining the trace of the tape when the test head 120 is undocked. Then, the test head 120 is docked, and the operator releases a plurality of bolts 134 shown in FIG. 3 for fixing the test head 120 to correct the deviation of the test head 120. The plurality of bolts 134 are reassembled and the test head 120 is undocked. Then, a new tape is attached to the performance board 122.

The above mentioned operation can be repeated. The operation for setting the docking position of the test head 120 and the probe station 110 is generally performed by an operator. Therefore, a known alignment apparatus may be used to perform the set-up operation of the test head 120 and the probe station 110. When the set-up operation is completed, the first monitoring tool 142 of the alignment monitor 140 is placed at the test head 120, and the second monitoring tool 146 is placed on the probe station 110.

Then, a position of the display unit 152 of the second monitoring tool 146 is adjusted to allow the reference marks 144a, 152a of the monitoring tools 142, 146 to be corresponding to each other. The display unit 152 of the second monitoring tool 146 is placed close to the confirmation window 144. After the alignment of the reference marks 144a, 152a of the first and the second monitoring tools 142, 146 is completed, the test operation for the wafer W begins.

Figure 7:
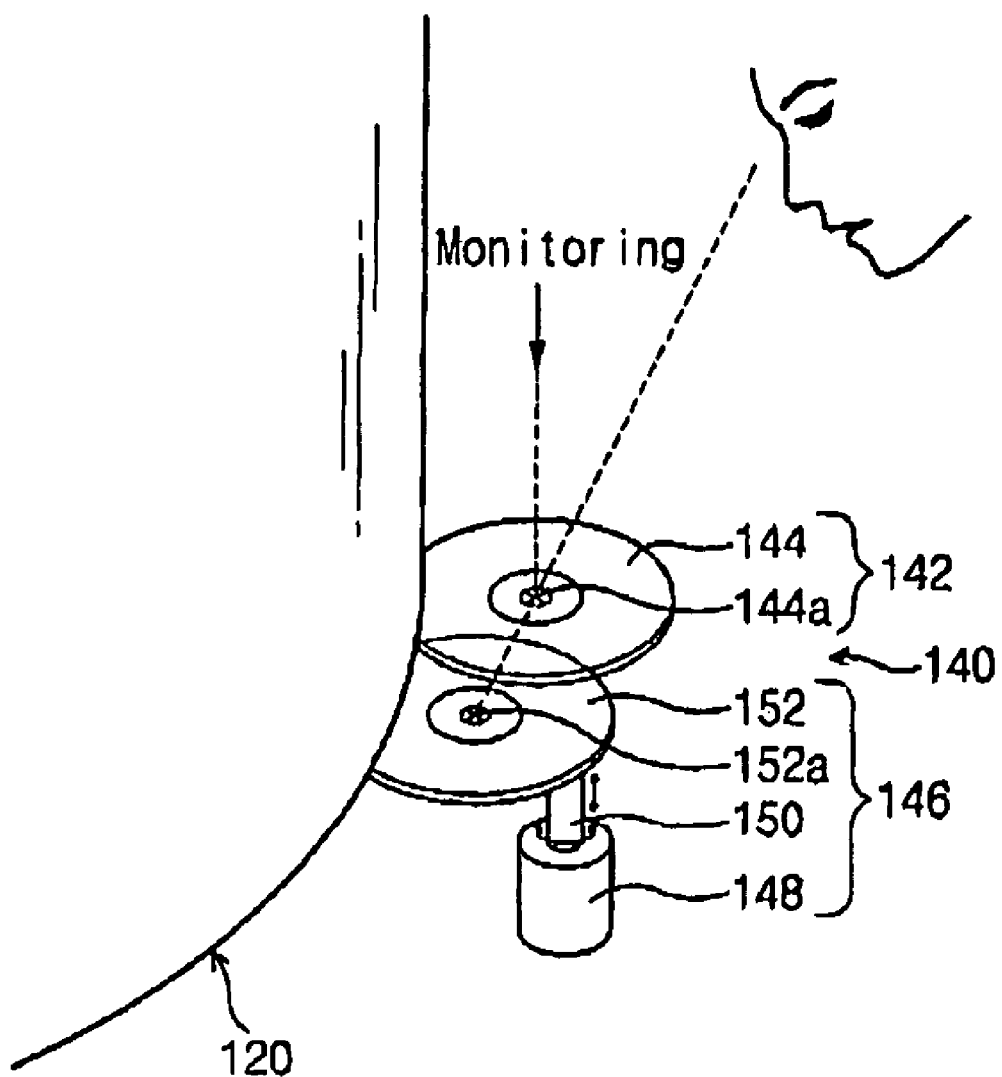
FIG. 7 is a view illustrating a feature of monitoring a correspondence of reference marks by an operator.

Whether the reference mark 144a of the first monitoring tool 142 and the reference mark 152a of the second monitoring tool 146 correspond to each other can be checked by an operator with his eyes when the test head 120 is docked at the probe station 110. As shown in FIG. 7, when an operator checks a correspondence between the reference mark 144a of the first monitoring tool 142 and the reference mark 152a of the second monitoring tool 146, the result can be different depending on the operator's view point.

Figure 5:
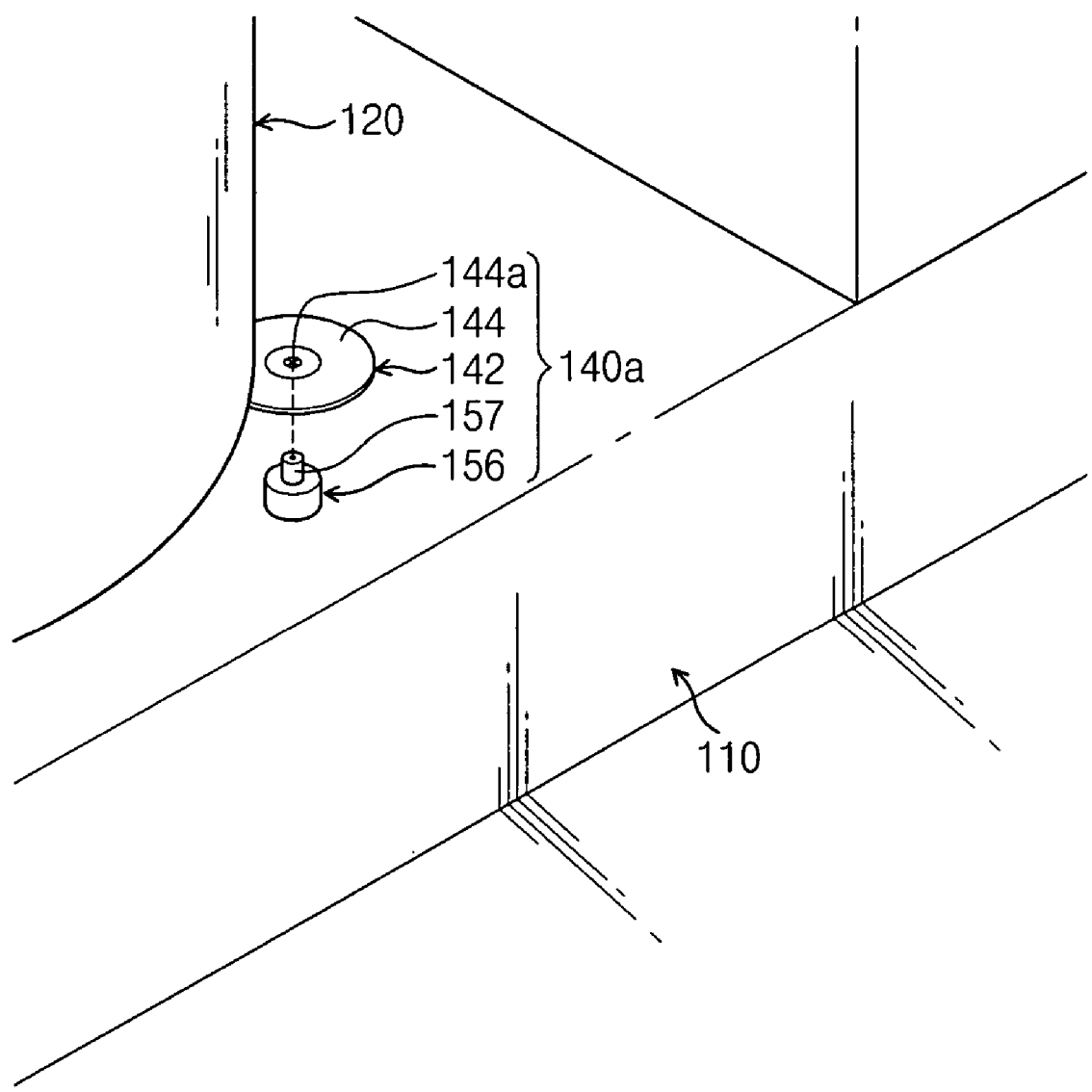
FIG. 5 is a view illustrating an alignment monitoring member according to another exemplary embodiment of the present invention.
Figure 6:
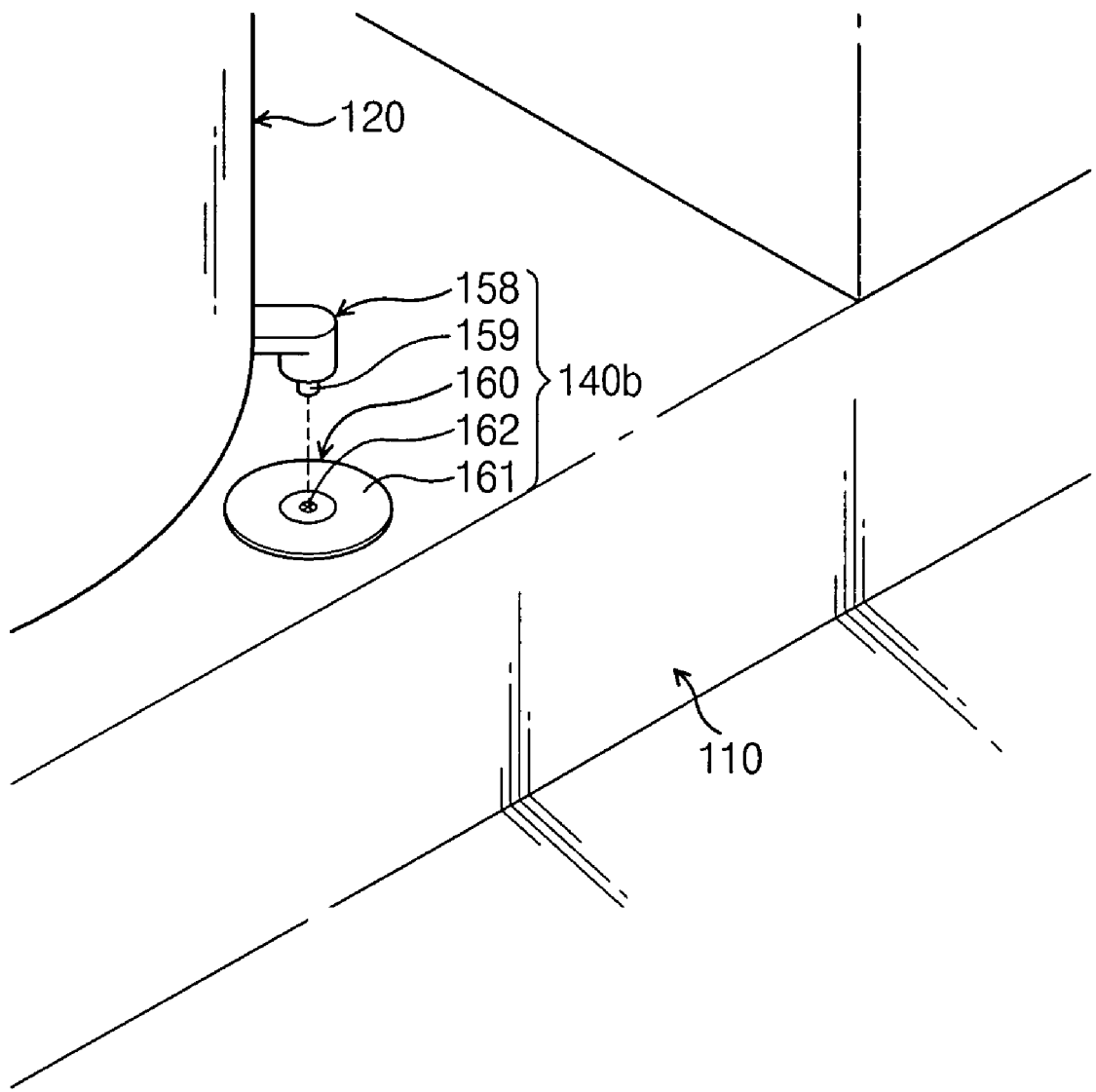
FIG. 6 is a view illustrating an alignment monitoring member according to still other exemplary embodiment of the present invention.

Monitoring members, according to exemplary embodiments of the present invention, are shown respectively in FIGS. 5 and 6. The monitoring member 140a includes a first monitoring tool 142 having a confirmation window 144 with the reference mark 144a thereon. The first monitoring tool 142 is placed at the test head 120. The monitoring member 140a includes a second monitoring tool 156 having a light source 157 for irradiating vertically upward. The second monitoring tool 156 having the light source 157 is placed on the probe station 110, and irradiates the reference mark 144a of the first monitoring tool 142. The amount of the light coming out of the reference mark 144a can be determined by operators' eyes.

The monitoring member 140b in FIG. 6 includes a first monitoring tool 158 having a light source 159 for irradiating vertically downward. The first monitoring tool 158 is placed at the test head 120. The monitoring member 140b further includes a second monitoring tool 160 placed on the probe station 110. The second monitoring tool 160 comprises a display unit 161 on which a reference mark 162 is formed. The reference mark 162 on the second monitoring tool 160 is placed on the probe station 110 and being irradiated by the light source 159. The second monitoring tool 160 may be attached to the probe station 110 by an adhesive tape so that the second monitoring tool 160 can be detachable from the probe station 110. An exact position of light irradiated to the display unit 161 can be determined regardless of operators' view point.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention.

What is claimed is:

1. Wafer test equipment comprising:
   a probe station having a wafer chuck for supporting a wafer;
   a test head disposed on the probe station;
   a manipulator for moving the test head to and from an upper surface o the probe station; and
   an alignment monitoring member for monitoring an alignment of the test head docked to the probe station.

2. The wafer test equipment of claim 1, wherein the wafer test equipment comprises a plurality of the alignment monitoring members.

3. The wafer test equipment of claim 1, wherein the alignment monitoring member comprises:
   a first monitoring tool which is placed at the test head and includes a transparent confirmation window with a reference mark;
   a second monitoring tool which is placed on the probe station and includes a display unit with a reference mark,
   wherein an alignment of the test head is monitored depending on correspondence between the reference mark of the first monitoring toot and the reference mark of the second monitoring tool.

4. The wafer test equipment of claim 3, wherein the display unit of the second monitoring tool moves upwardly and downwardly.

5. The wafer test equipment of claim 3, wherein the display unit of the second monitoring tool is rotational.

6. The wafer test equipment of claim 4, wherein the second monitoring tool comprises:
   a body fixedly attached to an upper surface of the probe station; and
   a vertical bar having a display unit thereon, the vertical bar being apwardly and downwardly movable.

7. The wafer test equipment of claim 1, wherein the alignment monitoring member comprises:
   a first monitoring tool which is placed on the test head and has a reference mark; and
   a second monitoring tool which is placed on the probe station and has a light source to irradiate the reference mark vertically, wherein an alignment of the test head is monitored based on a deviation of light from the reference mark.

8. The wafer test equipment of claim 1, wherein the alignment monitoring member comprises:
   a first monitoring tool which is placed on the test head and has a light source for irradiating vertically an upper surface of the probe station; and
   a second monitoring tool which has a reference mark and is attached to the upper surface of the probe station, the reference mark being irradiated by the light source, wherein an alignment of the test head is monitored based on a deviation of light from the reference mark.

9. A method of arranging wafer test equipment, the method comprising:
   setting a docking position of a probe station and a test head;
   placing a first monitoring tool to the test head and placing a second monitoring tool on the probe station; and
   adjusting a position of a confirmation window of the first monitoring tool and a position of the display unit of the second monitoring tool so that the reference mark on the confirmation window of the first monitoring tool and the reference mark on the display unit of the second monitoring tool correspond to each other.

10. The method of arranging wafer test equipment of claim 9, further comprising monitoring if the reference mark of the first monitoring tool and the reference mark of the second monitoring tool are corresponding to each other when the test head is docked to the probe station.

11. An alignment monitoring member for wafer test equipment having a test head and a probe station, the alignment monitoring member comprising:
   a first monitoring tool having a light source; and
   a second monitoring tool having a reference mark for receiving light that is irradiated from the light source of the first monitoring tool to align the test head and the probe station.

* * * * *